United States Patent
Yoshitake et al.

(10) Patent No.: US 6,801,827 B2
(45) Date of Patent: Oct. 5, 2004

(54) OVERLAY INSPECTION APPARATUS FOR SEMICONDUCTOR SUBSTRATE AND METHOD THEREOF

(75) Inventors: Yasuhiro Yoshitake, Yokohama (JP); Shunichi Matsumoto, Yokohama (JP); Toshiharu Miwa, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/268,716

(22) Filed: Oct. 9, 2002

(65) Prior Publication Data
US 2003/0033046 A1 Feb. 13, 2003

Related U.S. Application Data

(62) Division of application No. 10/198,394, filed on Jul. 17, 2002.

(30) Foreign Application Priority Data
Jul. 17, 2001 (JP) ........................................ 2001-216130

(51) Int. Cl.$^7$ ............................................. G06F 19/00
(52) U.S. Cl. ........................ 700/121; 700/124; 356/400; 356/401; 716/21
(58) Field of Search ............................... 700/121, 124; 438/14, 669; 365/400, 401; 716/21

(56) References Cited

U.S. PATENT DOCUMENTS

| | | | | |
|---|---|---|---|---|
| 4,626,907 A | * | 12/1986 | Schedewie | ................ 356/401 |
| 5,124,927 A | * | 6/1992 | Hopewell et al. | ........... 700/121 |
| 5,754,300 A | * | 5/1998 | Magome et al. | ............ 356/401 |
| 6,061,606 A | * | 5/2000 | Ross | ......................... 700/121 |
| 6,079,256 A | * | 6/2000 | Bareket | ................. 257/E21.53 |
| 6,344,892 B1 | * | 2/2002 | Sugita et al. | ................. 353/53 |
| 6,479,904 B1 | * | 11/2002 | Maejima | .................... 257/797 |
| 6,484,060 B1 | * | 11/2002 | Baluswamy et al. | ........ 700/121 |
| 6,486,956 B2 | * | 11/2002 | Byers et al. | ................ 356/401 |
| 6,573,986 B2 | * | 6/2003 | Smith et al. | ................ 356/124 |
| 6,612,159 B1 | * | 9/2003 | Knutrud | ...................... 73/105 |

FOREIGN PATENT DOCUMENTS

JP      10-312958      11/1998

OTHER PUBLICATIONS

Terasawa "Photolithography and ULSI," Optical Alliance, Jan. 1998, pp. 1–6, abstract only.

Farrar et al. "In–situ measurement of lens aberrations," SPIE 4000:18–29 (2000).

Yoshitake et al., Multispot Scanning Exposure System for Excimer Laser Stepper, SPIE 1463:678–687 (1991).

\* cited by examiner

Primary Examiner—Leo Picard
Assistant Examiner—Charles Kasenge
(74) Attorney, Agent, or Firm—Townsend and Townsend and Crew LLP

(57) ABSTRACT

A system for manufacturing a semiconductor device which predicts a difference in registration error between a circuit pattern and an overlay mark from a pattern dimension, illumination conditions and the wave aberration of an exposure lens, feeds a correction value based on the predicted difference back to an exposure device and modifies an overlay inspection data control limit.

13 Claims, 13 Drawing Sheets

OVERLAY INSPECTION APPARATUS FOR SEMICONDUCTOR SUBSTRATE AND METHOD THEREOF

This is a division of application Ser. No. 10/198,394 filed Jul. 17, 2002.

BACKGROUND OF THE INVENTION

The present invention relates to a method for manufacturing a semiconductor device and more particularly, to a method and system for accurately detecting and correcting an overlay error in a light exposure step.

A semiconductor device manufactured by repeating for each layer a step of depositing a conductive or insulating film on a wafer and a lithography step of coating a resist as a photosensitive agent on the film, subjecting the resist to light exposure with a circuit pattern on a reticle disposed therebetween, developing it and etching the film with use of the remaining resist as a mask to thereby form the circuit pattern on the wafer. At this time, when the circuit pattern during the exposure is positionally shifted (has a registration error) to a pattern of an underlying layer, the circuit is disconnected or short-circuited, which results in that a resulting semiconductor device becomes faulty. To avoid this, prior to the exposure of the circuit pattern, the exposure apparatus optically detects alignment marks provided in an outer periphery of the circuit pattern as an underlying layer, measures the position of the underlying layer, and corrects the transfer position to thereby realize alignment between the underlying layer and exposure layer.

Further, after actual exposure and transfer (prior to etching), an overlay inspection equipment measures a relative registration error between the overlay mark of the underlying layer and the overlay mark of the exposure layer, and feeds the registration error back to the exposure apparatus as a correction. When the registration error exceeds its allowable value, the exposure apparatus, after stripping the resist, performs re-coating, light exposing and developing operations. Such work is called re-work. That is, the overlay inspection is carried out for the purpose of judging necessity or non-necessity of the feedback to the exposure apparatus and re-work.

It is assumed in the above alignment inspection that the registration error measured based on the overlay mark indicates the registration error of the circuit pattern. However, now that, as the circuit pattern is made finer, the shift allowable value is made smaller, it has been found that there sometimes occurs such a situation that the above fact cannot hold true. The registration error depends on the wave aberration of an exposure lens. This will be explained below by referring to FIG. 18.

An exposure lens 30, for example, has a coma aberration 300 as the wave aberration. This is asymmetrical aberration resulting, for example, from the eccentricity and tilt of an element lens and the surface accuracy error of the lens surface at the time of assembling the exposure lens 30. The coma aberration 300 has a tilt large in the vicinity of the periphery of the exposure lens 30. A light beam passing through the exposure lens 30 is bent by an amount proportional to the tilt of the coma aberration 300. Meanwhile, the angle of the beam diffracted by a reticle varies with the spatial frequency of a transfer pattern. Accordingly when the spatial frequency of the transfer pattern varies, the position of the beam passing through the exposure lens 30 is changed, thus changing also the registration error. FIGS. 18A and 18B show diagrams when an exposure beam 2003 is directed into a rough pattern 210 and a fine pattern 220 respectively. Since a diffracted beam 2005 of the fine pattern 220 of FIG. 18B having a large diffraction angle passes through the exposure lens 30 closer to its periphery than that of the rough pattern 210 of FIG. 18A, a registration error Δx' of FIG. 18B is larger than a registration error Δx of FIG. 18A. This means that, since the spatial frequency varies with the circuit pattern and overlay mark, the registration error during transfer also varies, which leads to the fact that the aforementioned overlay inspection assumption is not satisfied.

With respect to light exposure, in addition to such usual illumination as shown in FIG. 19A, there may be employed annular illumination as described in a literature entitled "Optical Alliance", January, 1998, page 4. FIG. 19B shows a case of annular illumination. In the annular illumination, an illumination light flux 2002 has an annular section and has an effect of enhancing the contrast of the transfer pattern. As shown in FIG. 19B, a registration error ΔX' of the transfer pattern of the light flux expanded outwards becomes larger than a registration error ΔX of the usual illumination. This means that even illumination conditions also affects a difference in registration error between the circuit pattern and overlay mark.

In order to solve the above problem, there is disclosed a method for performing overlay inspection with use of an overlay mark as a pattern having a spatial frequency similar to a circuit pattern in JP-A-10-312958.

The above known art may have problems which follow. That is, to make to coincide with the spatial frequency of the circuit pattern, an overlay mark 214 includes such a pattern 215 of several lines as shown in FIG. 20. However, since the pattern is fine and long, a part of the line pattern in the vicinity of an end of the overlay mark may fall or may tend to become easily asymmetrical under the influences of halation or wave aberration from an adjacent part 41. A registration error with respect to the underlying layer is calculated by processing the waveform of an optical image 2140 of the entire line pattern. Thus, when one end of the line pattern becomes asymmetrical, an error ΔER may be generated in the measured registration error.

SUMMARY OF THE INVENTION

It is therefore and object of the present invention to provide a semiconductor manufacturing method for correcting a difference in registration error between a circuit pattern and an overlay mark while eliminating the need for modifying the overlay mark to a fine line pattern. Novel features of the present invention will become clear from the description of the present specification and attached drawings.

Some aspects of inventions disclosed in the present application are as follows.

There is provided a method of manufacturing a semiconductor device, which includes the steps of measuring an actual registration error between a transfer image when a first overlay mark formed on a first reticle is actually formed as transferred on a substrate with use of a first aligner or exposure equipment and a transfer image when a second overlay mark formed on a second reticle is formed as transferred on the substrate, predicting an actual registration error between the transfer images of the circuit patterns from data of the measured registration error by use of a previously determined relationship between a registration error between a transfer image formed when a first circuit pattern formed on the first reticle is transferred to the substrate by use of the first exposure equipment and a registration error between a transfer image formed when a second circuit pattern formed on the second reticle is transferred to the substrate by use of the second aligner or exposure equipment and also with use of the registration error between the transfer images of the overlay marks, correcting the second exposure device on the basis of the predicted registration error information between the transfer images of the circuit patterns, and subjecting the second circuit pattern subjected by the first exposure equipment to light exposure by the corrected second exposure equipment to light exposure.

As a result, the system can accurately predict the registration error of the circuit pattern from the measured value of the registration error of the overlay mark, can set a suitable correction value for the exposure equipment, and can increase the yield of the semiconductor device.

Further, the circuit pattern is a circuit pattern having the severest tolerance of the overlay specifications. Since the system can set the correction value for the circuit pattern which has the severest tolerance of the overlay specification, the system can increase the yield when compared with a case of using a correction value determined from a circuit pattern which has the severest tolerance of the overlay specification.

There is provided an overlay control method for subjecting a circuit pattern in a second layer formation process to light exposure on a circuit pattern in a first layer formation process to manufacture a semiconductor, wherein an overlay error central control limit and upper and lower control limits are determined from an actual measurement data of a circuit pattern registration error and overlay mark registration error measured before the manufacturing.

As a result, the overlay error as abnormality generation in the circuit pattern can be detected, thus enabling quick abnormality analysis and measure.

There is provided a system for manufacturing a semiconductor device wherein a circuit pattern in a second layer formation process is subjected to light exposure on a circuit pattern in a first layer formation process. The system includes a history storage device for storing a history of an exposure equipment, illumination conditions and a reticle used for manufacturing of a substrate to be exposed; a reticle data storage device for storing a dimension of a circuit pattern of the reticle, a dimension of an overlay mark, a coordinate value of the circuit pattern and a coordinate value of the overlay mark; an illumination conditions storage device for storing the exposure equipment and illumination conditions for each process; a wave aberration data storage device for storing wave aberration data for each exposure equipment and each pattern coordinate value; a registration error calculation device for calculating a circuit pattern registration error of a second layer formation process to a first layer formation process and an overlay mark registration error of the second layer formation process to the first layer formation process from the illumination conditions, the circuit pattern dimension, the overlay mark dimension and the wave aberration for each coordinate value; a registration error relationship calculation device for calculating a relationship between the circuit pattern registration error and the overlay mark registration error; a registration error relationship storage device for storing the registration error relationship, a name of the first layer formation process, a name of the second layer formation process, exposure equipments, illumination conditions and reticles used in the first and second layer formation processes; an overlay control limit storage device for storing an overlay control limit for each product and process; an overlay control limit conversion device for converting the overlay control limit from the registration error relationship; an overlay inspection data storage device for storing overlay inspection data; a correction calculating device for calculating a correction of the second exposure equipment from the registration error relationship and the overlay inspection data; a host computer for performing control of an entire semiconductor manufacturing apparatus and input and output of information; an input/output control device for performing transfer of information of the plurality of storage device, a plurality of calculation device, selection device and judgement device and transmitting a correction value calculated by a start device issued from the start device judging device and by the correction value calculation device or a correction value issued from a combination of the information storage device to the host computer; an exposure equipment; and an overlay inspection equipment.

According to the present system, upon manufacturing a semiconductor device, a relationship between the circuit pattern registration error and overlay mark registration error in first and second layer formation processes can be quickly extracted from a history of the substrate to be exposed, and abnormality detection in an overlay inspection and feedback of a correction to the exposure equipment can be quickly achieved.

These and other objects, features and advantages of the invention will be apparent from the following more particular description of preferred embodiment of the invention as illustrated in the accompanying drawings.

DESCRIPTION OF THE EMBODIMENTS

Figure 1:
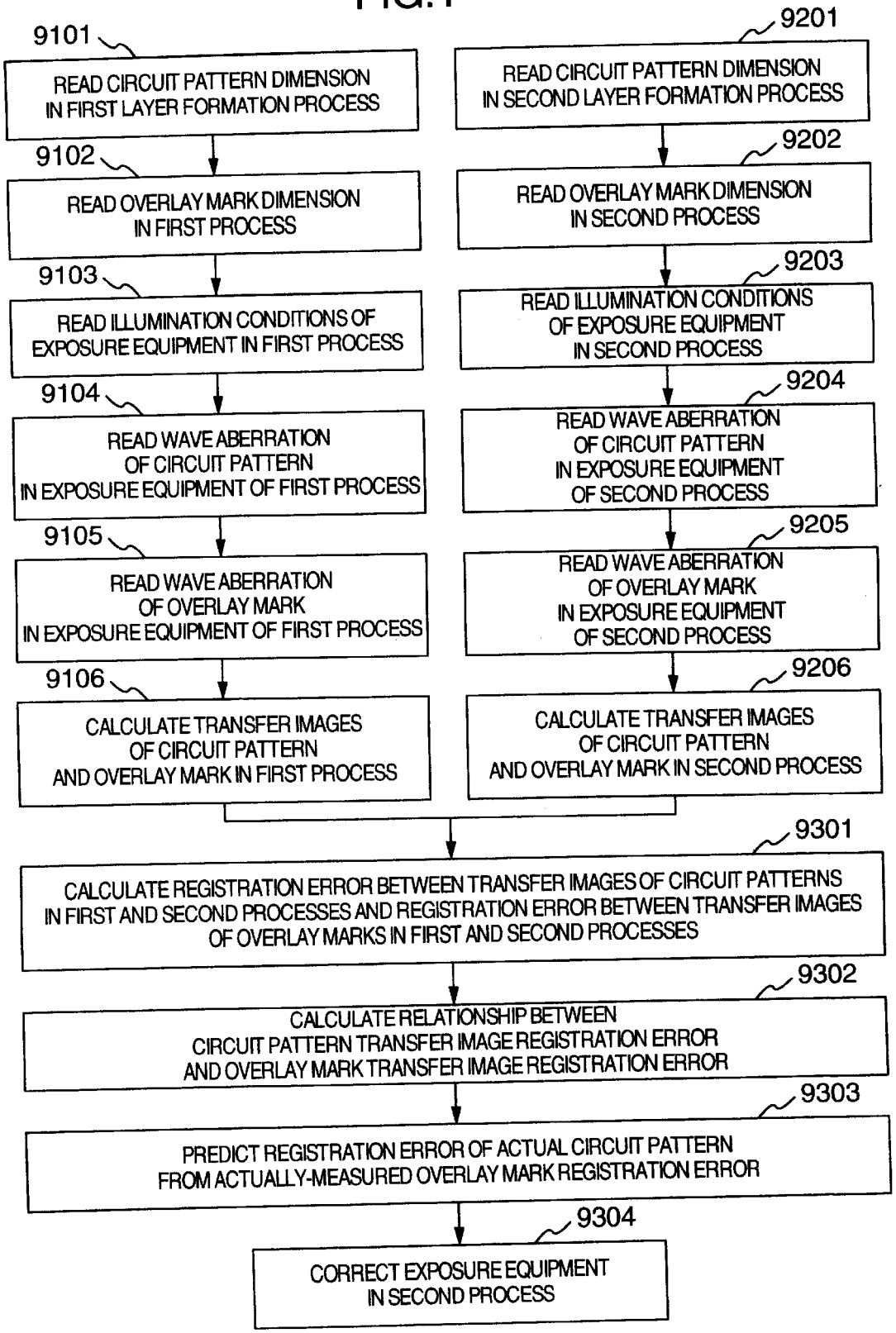
FIG. 1 is a flowchart for explaining a flow of how to predict a registration error in a circuit pattern in accordance with the present invention to correct an exposure apparatus.

An embodiment of the present invention will be explained with reference to the accompanying drawings. FIG. 1 shows a flowchart for explaining a flow of a method for manufacturing a semiconductor in accordance with an embodiment of the present invention.

In a step 9101 of a first layer formation process, first, the system reads dimensional data on a circuit pattern on a reticle. In a next step 9102 of the first layer formation process, the system reads overlay mark dimensions of the reticle. The dimensions includes widths and pitches of the circuit pattern and overlay mark. In a step 9103 of the first layer formation process, further, the system reads illumination conditions of an exposure equipment. Examples of the illumination conditions and a definition method will be explained later. In a step 9104 of the first layer formation process, the system reads wave aberration data on the height of an image of the circuit pattern. How to measure the wave aberration data will be explained later. In a step 9105 of the first layer formation process, the system then reads the wave aberration data of the height of an image of the overlay mark in the exposure equipment. In a next step 9106, transfer images of the circuit pattern and overlay mark are calculated on the basis of the circuit pattern dimension, overlay mark dimensions, illumination conditions, the wave aberration of the circuit pattern image height and the wave aberration of the overlay mark image height. How to calculate the transfer images will be explained later.

In a second layer formation process, steps 9201 to 9206 are carried out in a substantially same manner as the steps 9101 to 9106 of the first layer formation process.

In a step 9301, the system calculates a registration error in the circuit pattern transfer image and a registration error in the overlay mark between the first and second layer formation processes. How to calculate the registration errors will be explained later. The system find, in a step 9302, a relation between the circuit pattern transfer image registration error and overlay mark transfer image registration error. In a next step 9303, on the basis of the relation between the above registration errors, the system predicts an actual registration error of the circuit pattern from the actually-measured overlay mark registration error, and feeds, in a step 9304, a correction corresponding to the registration error back to the exposure equipment of the second process.

Explanation will now be made as to how to calculate the transfer image by referring to FIG. 2. First of all, in order to calculate a transfer image of a circuit pattern as a target to a substrate 4 to be exposed with light, data about illumination conditions 2000, a circuit pattern 200 on a reticle 2 and a wave aberration 300 of an exposure lens 30 become necessary. A method for calculating an image using these data is disclosed, for example, in 'Y. Yoshitake et al, SPIE Vol. 1463, pp 678–679, 1991'.

Figure 3A:
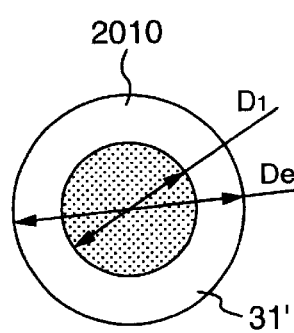
FIGS. 3A, 3B and 3C are diagrams for explaining illumination conditions among the parameters of FIG. 2.
Figure 3B:
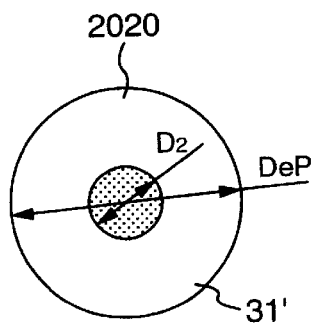
Figure 3C:
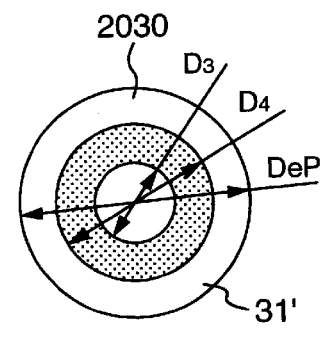

Explanation will now be made as to a specific example of the illumination conditions 2000. FIG. 3A shows a case of general or usual illumination wherein a diameter D1 of an illumination light source image 2010 and a diameter Dep of an image 31' of an aperture 31 of the exposure lens 30 can be expressed as its parameters. FIG. 3B shows a case of illumination conditions when the circuit pattern 200 has phase information in addition to mono-chrome information, i.e., when a so-called phase shift reticle is used, and wherein a ratio of a diameter D2 of an illumination light source image to the diameter Dep is smaller than that in FIG. 3A. FIG. 3C shows a case of overlay inspection wherein an outer diameter D4 and inner diameter D3 of an illumination light source image 2030 and the diameter Dep can be expressed as its parameters.

Figure 2:
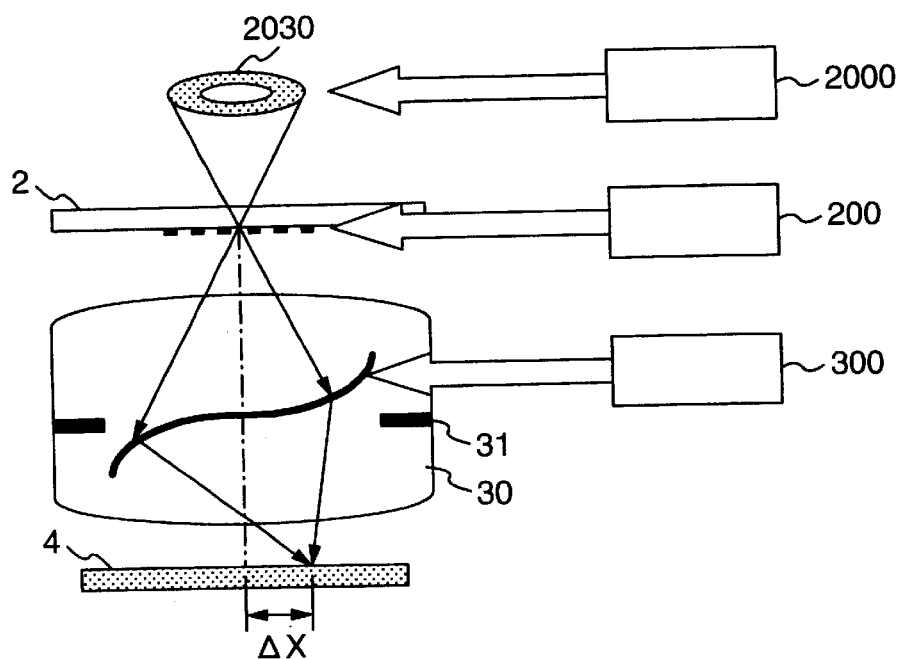
FIG. 2 is a diagram for explaining parameters necessary for calculation of a transfer image.
Figure 4A:
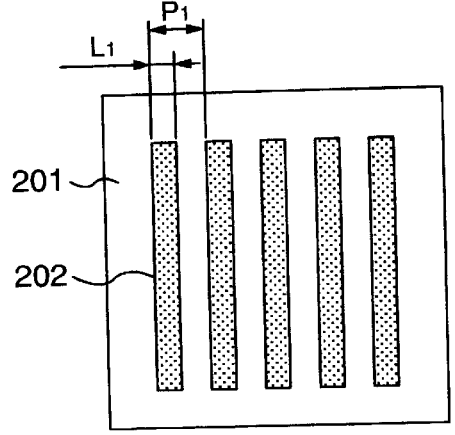
FIGS. 4A and 4B are diagrams for explaining a circuit pattern among the parameters of FIG. 2.
Figure 4B:
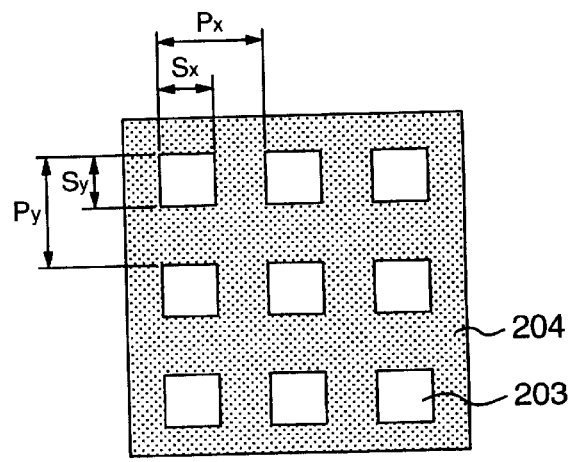

Explanation will then be made as a specific example of the circuit pattern 200 in FIG. 2 by referring to FIGS. 4A and 4B. In FIG. 4A shows a pattern of lines and spaces having a transparent part 201 and light shielding parts 202. A width L1 of the light shielding part 202 and a pitch P1 of the line/space pattern can be expressed as parameters of the line/space pattern. FIG. 4B shows an example of a hole pattern having a light shielding part 204 and openings 203. In this case, a width Sx of each opening and a pitch Px of the openings in an x direction as well as a width Sy of each opening and a pitch Py of the openings in a y direction can be expressed as parameters.

Figure 5A:
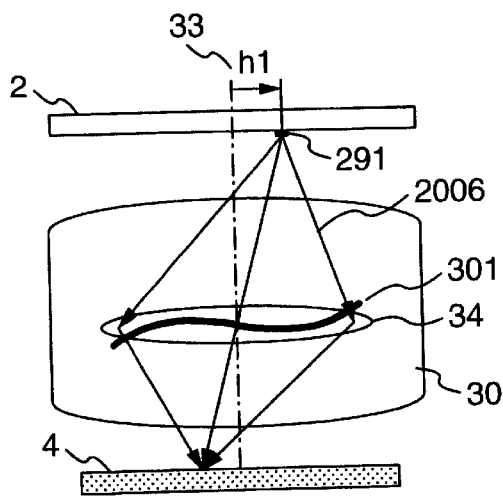
FIGS. 5A and 5B are diagrams for explaining a difference in generation of wave aberration in a coordinate system on a reticle.
Figure 5B:
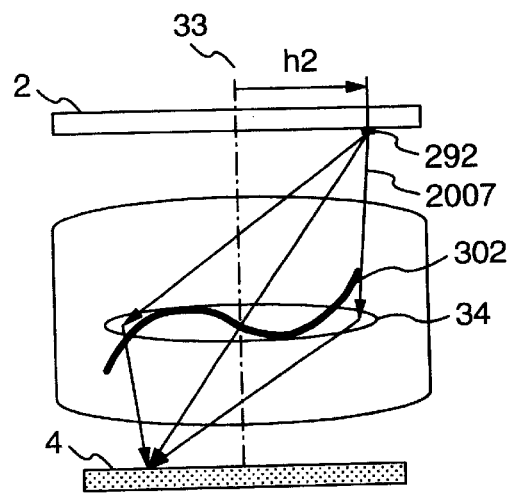

Explanation will now be made by referring to FIGS. 5A and 5B as to the reason why light issued from different points of a reticle in a pattern coordinate system and then passed through a lens has different wave aberrations. In FIG. 5A, a beam 2006 issued from a point 291 of a reticle 2 is passed through an exposure lens 30 and then focused on a substrate 4 to be exposed with light. The point 291 is located at a coordinate position spaced by h1 from a center 33 of the lens. In FIG. 5B, a beam 2007 issued from a point 292 of the reticle 2 is passed through the exposure lens 30 and then focused on the substrate 4 to be exposed with light. The point 292 is located at a coordinate position spaced by h2 from the center 33 of the lens. The beams 2006 and 2007 have different incident angles to an element lens 34 provided inside of the exposure lens 30, and thus provide different wave aberrations 301 and 302.

Figure 6:
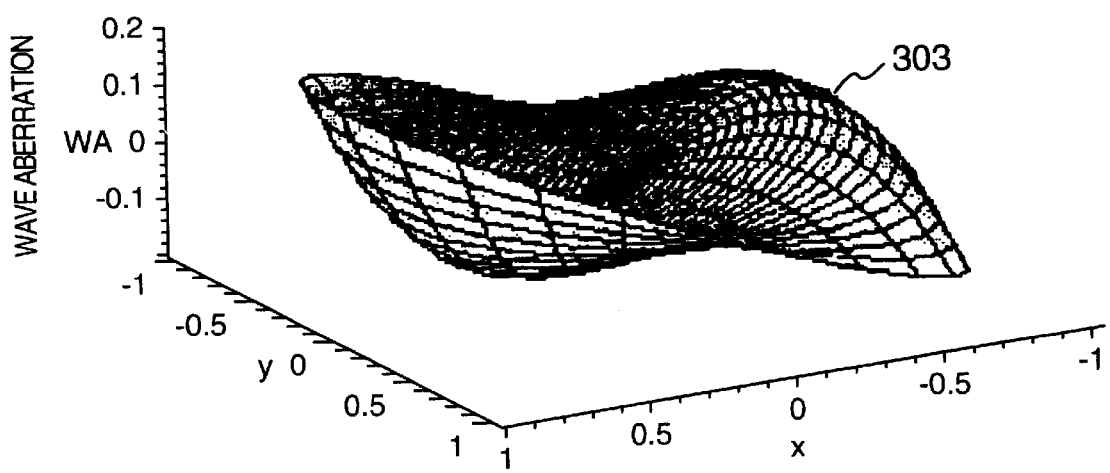
FIG. 6 is a diagram for explaining the wave aberration among the parameters of FIG. 2.

FIG. 6 shows an example of the wave aberration 300 in FIG. 2. The wave aberration 301 is an example of an asymmetrical coma aberration in the x direction, which is three-dimensional data. The wave aberration 301 can be measured at different coordinate positions spaced from the center of the exposure lens, for example, by such a method as disclosed in 'N. R. Farrar et al, SPIE Vol. 4000, pp19–22, 2000'.

Figure 7:
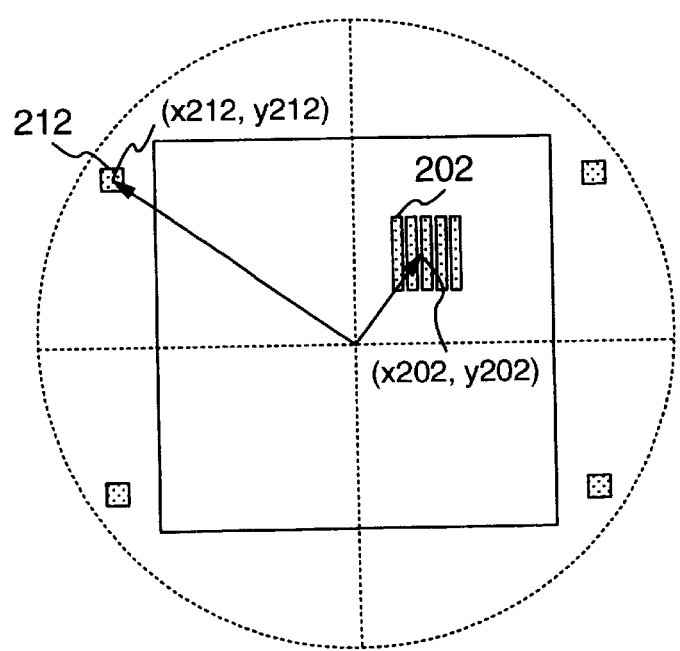
FIG. 7 is a diagram for explaining an example of a reticle pattern in a first layer formation process.
Figure 8:
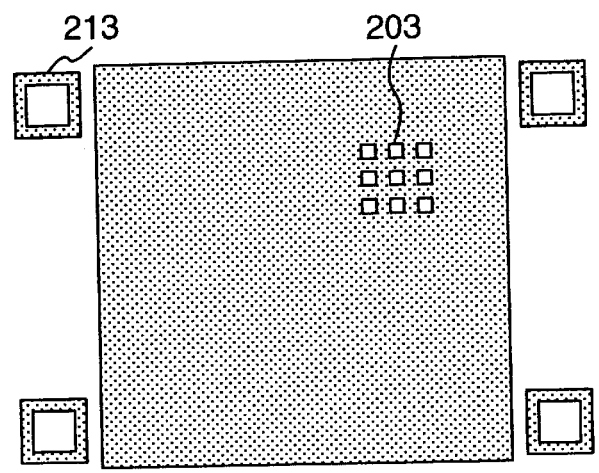
FIG. 8 is a diagram for explaining an example of a reticle pattern in a second layer formation process.

Explanation will next be made as to positioning of a circuit pattern and overlay marks with reference to FIGS. 7 and 8. FIG. 7 is an example of a reticle in the first layer formation process. In the drawing, a center coordinate value of a circuit pattern 202 is (x202, y202), and a center coordinate value of an overlay mark 212 is (x212, y212). In FIG. 8, the center coordinate values of the circuit pattern 203 of the reticle and overlay mark 213 in the second process are the same as those of the circuit pattern 202 and overlay mark 212.

Figure 9:
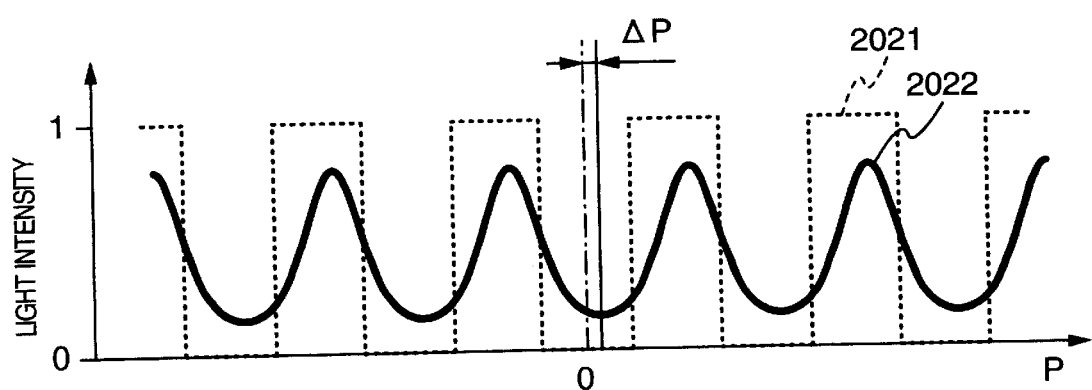
FIG. 9 is a diagram for explaining a shift in a transfer image.

Explanation will now be made as to how to calculate transfer image shifts in the circuit pattern and overlay mark, by referring to FIG. 9. A light intensity distribution 2021 is a light intensity distribution of a transfer image of a circuit pattern on the reticle 2, and a light intensity distribution 2022 is a light intensity distribution of a transfer image calculated by the above method. Because of the wave aberration. the light intensity distribution 2022 is shifted by ΔP from the light intensity distribution 2021 with respect to the light intensity distribution 2021 immediately after the reticle.

Figure 10:
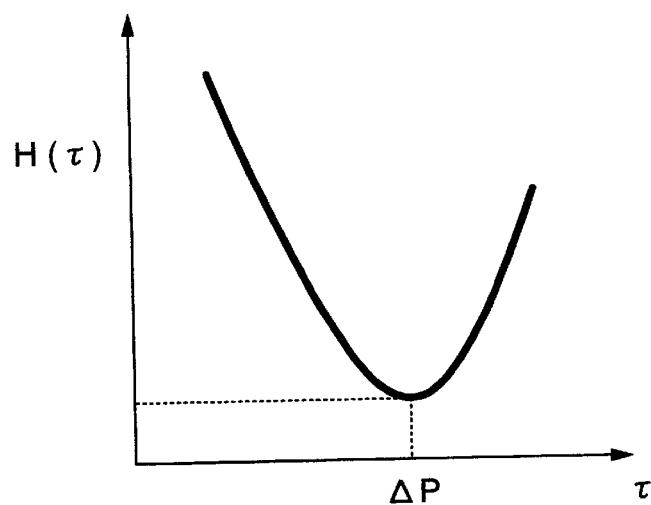
FIG. 10 is a graph for explaining a relationship between an image shift $\tau$ and a convolution integral of circuit pattern light intensity change and image light intensity change.
Figure 11:
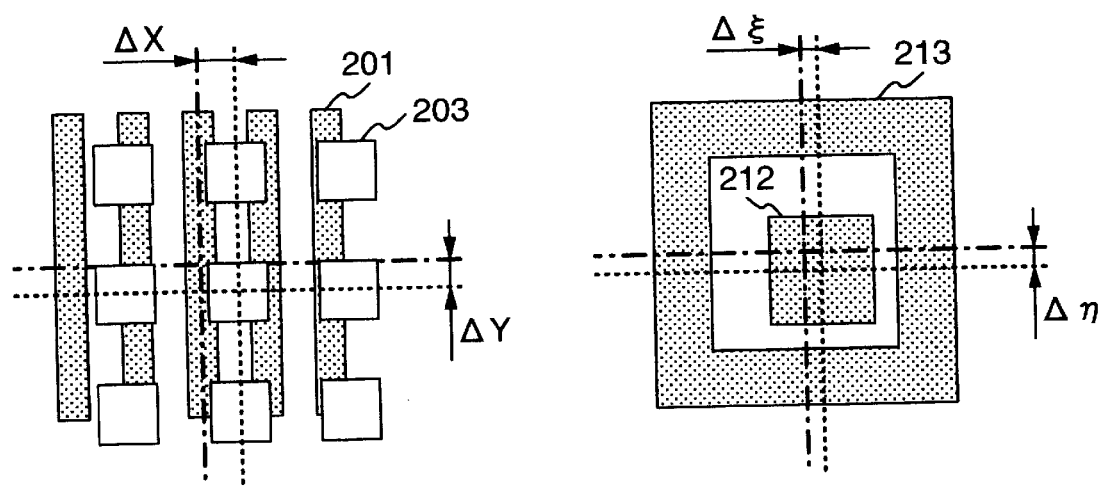
FIG. 11 is a diagram for explaining registration errors of a circuit pattern and an overlay mark in a second layer formation process to those in the first layer formation process.

Now how to calculate the shift ΔP will be explained. Assuming that the light intensity distribution 2021 of the circuit pattern is expressed by an equation F(x) and the light intensity distribution 2022 is expressed by an equation G(x), then convolution integral H(τ) of these is expressed as follows.

$$H(\tau) = \int F(x)G(\tau-x)dx \quad (1)$$

wherein τ denotes a shift in the image intensity distribution G(x). The convolution integral H(τ) indicates a disagreement degree of G(X) with F(x) when G(X) is shifted by τ, and thus when H(τ) is minimum, this is considered to be a most coincided state, that is, no image shift. As shown in FIG. 10, the value of τ when H(τ) is minimum corresponds to an image shift ΔP in FIG. 9.

Shown in FIGS. 1A and 1B are registration errors ΔX and ΔY of the circuit patterns 202 and 203 as well as registration errors Δξ and Δη in the first and second processes. The registration errors ΔX, ΔY, registration errors Δξ and Δη are obtained by calculating the above transfer image shifts ΔP of the circuit patterns and overlay marks in the first and second processes and then finding a difference between the image shifts in the first and second processes.

Explanation will next be made as to how to find a relationship in registration error between the overlay mark and circuit pattern. With respect to the X direction, an offset Ex is found by the following equation (2).

$$E_x = \Delta X - \Delta \xi \quad (2)$$

Figure 12:
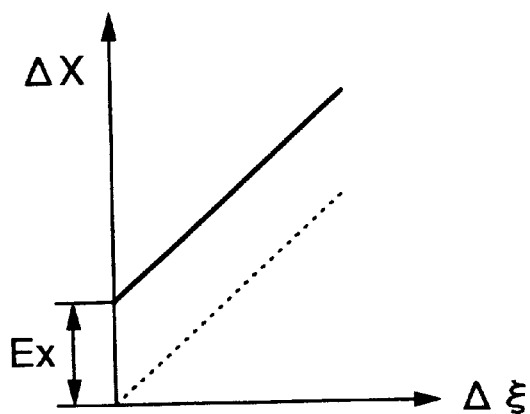
FIG. 12 is a graph for explaining a relationship between a registration error $\Delta\xi$ in an overlay mark and a registration error $\Delta X$ in a circuit pattern.

FIG. 12 shows a graph showing a relationship between ΔX and Δξ. Since ΔX and Δξ are in their very small ranges of 1 μm or less, these will not change the wave aberration and the registration error relation is determined only by the offset. With respect to even the Y direction, the offset is found in the similar manner to the X direction.

Figure 13:
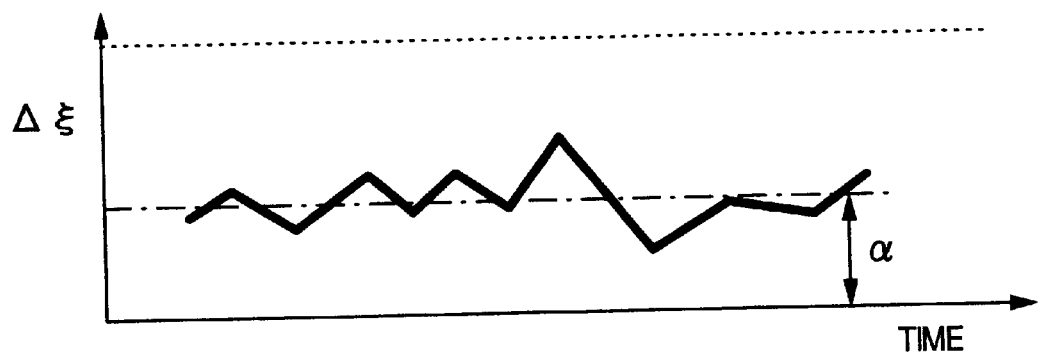
FIG. 13 is a diagram for explaining an average of past overlay inspection data.

Explanation will be made as to how to calculate a correction an overlay inspection result is fed back to the exposure equipment with reference to FIG. 13. First, an average value α of past overlay inspection data is calculated. Next, a correction β of the circuit pattern registration error is found by the following equation (3).

$$\beta = \alpha + \Delta X \quad (3)$$

Explanation will be made as to how to convert control limits to detect a registration error abnormality from an overlay inspection result. An upper control limit UCL, a lower control limit LCL and a central control limit CLL (=0) previously registered in a host computer based on a design are converted according to the following equations (4) to (6) in order to detect a registration error abnormality for the circuit pattern.

$$UCL' = UCL - E_x \quad (4)$$

$$LCL' = LCL - E_x \quad (5)$$

$$CCL' = -E_x \quad (6)$$

Figure 14:
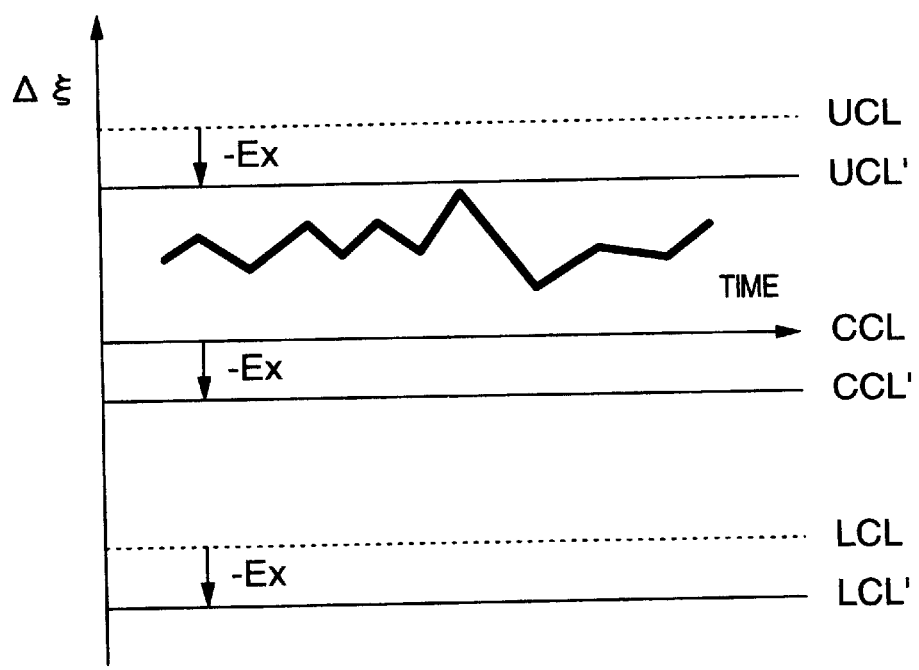
FIG. 14 is a diagram for explaining overlay control limits after and before modification.

Upper, lower and central control limits UCL', LCL' and CCL' after the conversion are shown in FIG. 14. Even for the Y direction, the above holds true.

Explanation will now be made as to a method for storing a registration error relationship between the circuit pattern and overlay mark and a method for modifying an overlay control limit using the storage method, by referring to FIGS. 15 and 16.

Figure 15:
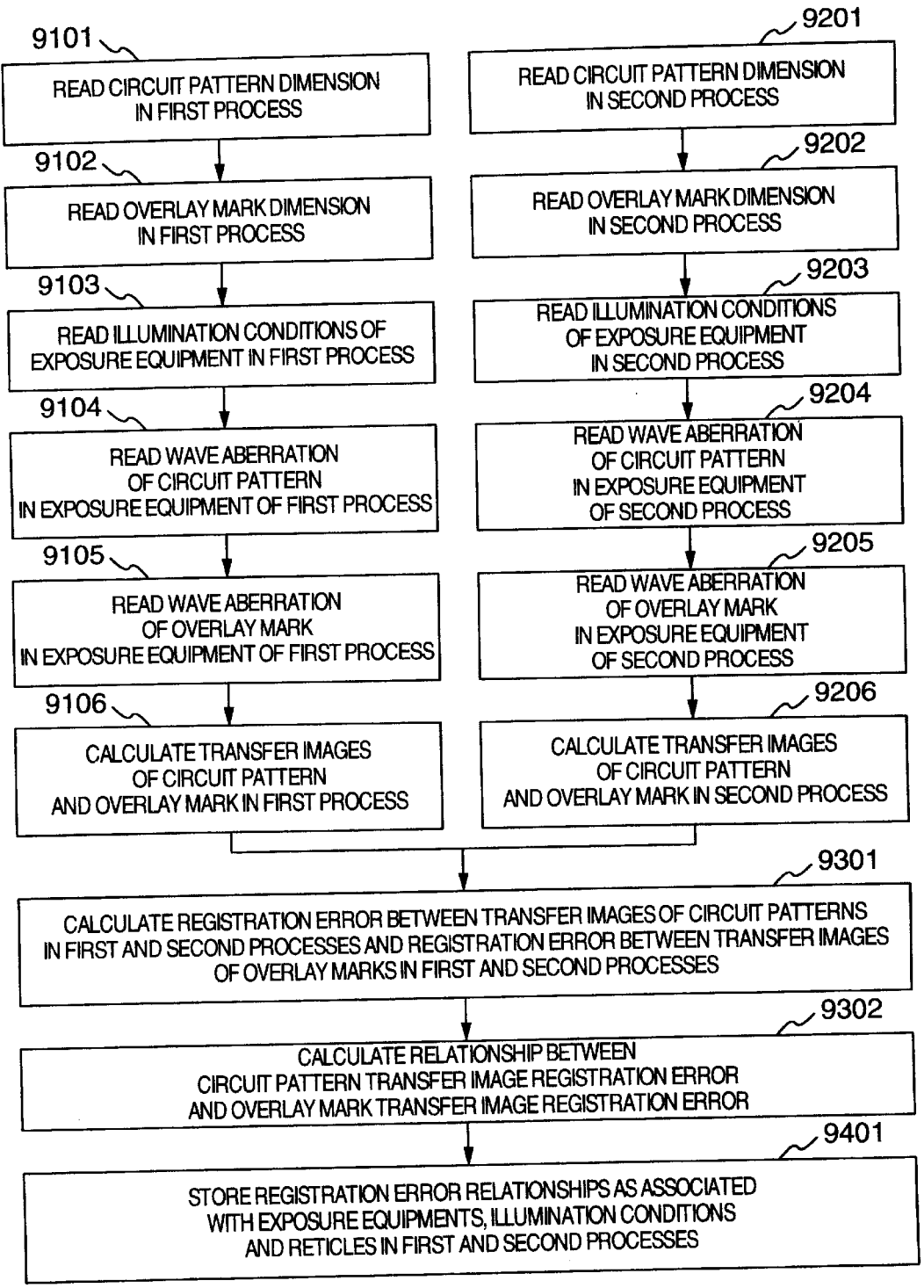
FIG. 15 is a flowchart for explaining a flow of how to store a relationship of registration errors between the circuit patterns and overlay marks.
Figure 16:
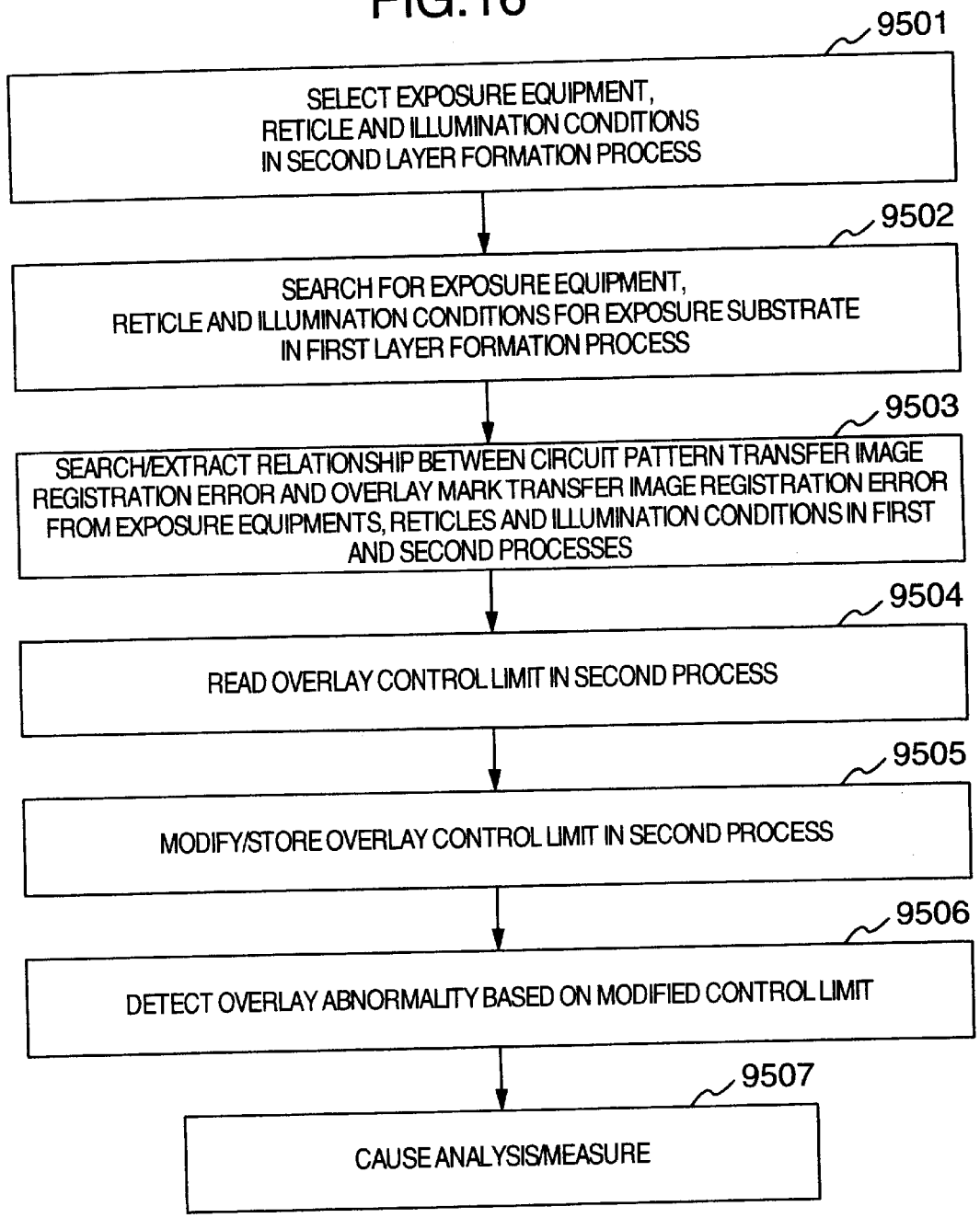
FIG. 16 is a flowchart for explaining a flow of modifying and using the overlay control limit.

In FIG. 15, steps of from reading of data to calculation of an overlay mark transfer image in the first and second processes are the same as the steps of 9101 to 9106 and the steps 9201 to 9206 in FIG. 1; and how to calculate a transfer image registration error and a method for calculating a relationship between the circuit pattern and overlay mark registration error are also the same as the steps 9301 and 9302. In a step 9401, to enable later search of the calculated registration error relationship, the exposure equipment, illumination conditions and reticle in the first layer formation process are stored as associated with those in the second process. More concretely, the registration error relationship is associated with offsets in X and Y directions (Ex in the X direction).

Explanation will next be made as to a processing flow of how to modify the overlay control limit with use of FIG. 16. In a step 9501, first of all, an exposure equipment, a reticle and illumination conditions are selected in a second process. This selection is carried out by a host computer which controls the entire manufacturing of a semiconductor device. The next and subsequent steps 9502 to 9506 are carried out by a semiconductor device manufacturing system which will be explained later. In the step 9502, the system searches history data of substrates to be exposed in the host computer for the exposure equipment, reticle and illumination conditions in the first layer formation process. In the next step 9503, the system searches for the registration error relationship stored in FIG. 15 according to the exposure equipment, reticle and illumination conditions.

In the next step 9504, the system reads an overlay control limit in the second process. The overlay control limit based on the design is already stored in the host computer, the system searches the host computer based on its process name. In the next step 9505, the system modifies and stores the overlay control limit using the above equations (4), (5) and (6) on the basis of the registration error relationship obtained in the step 9503, and detects an overlay abnormality with use of the control limit after the modification in step 9506.

The storage destination in the step 9505 may modify the overlay control limit within the host computer, and the abnormality detection in the step 9506 may be carried out by the host computer. In a step 9507, finally, the system performs its cause analysis and measure on the basis of the abnormality detection by a staff.

Figure 17:
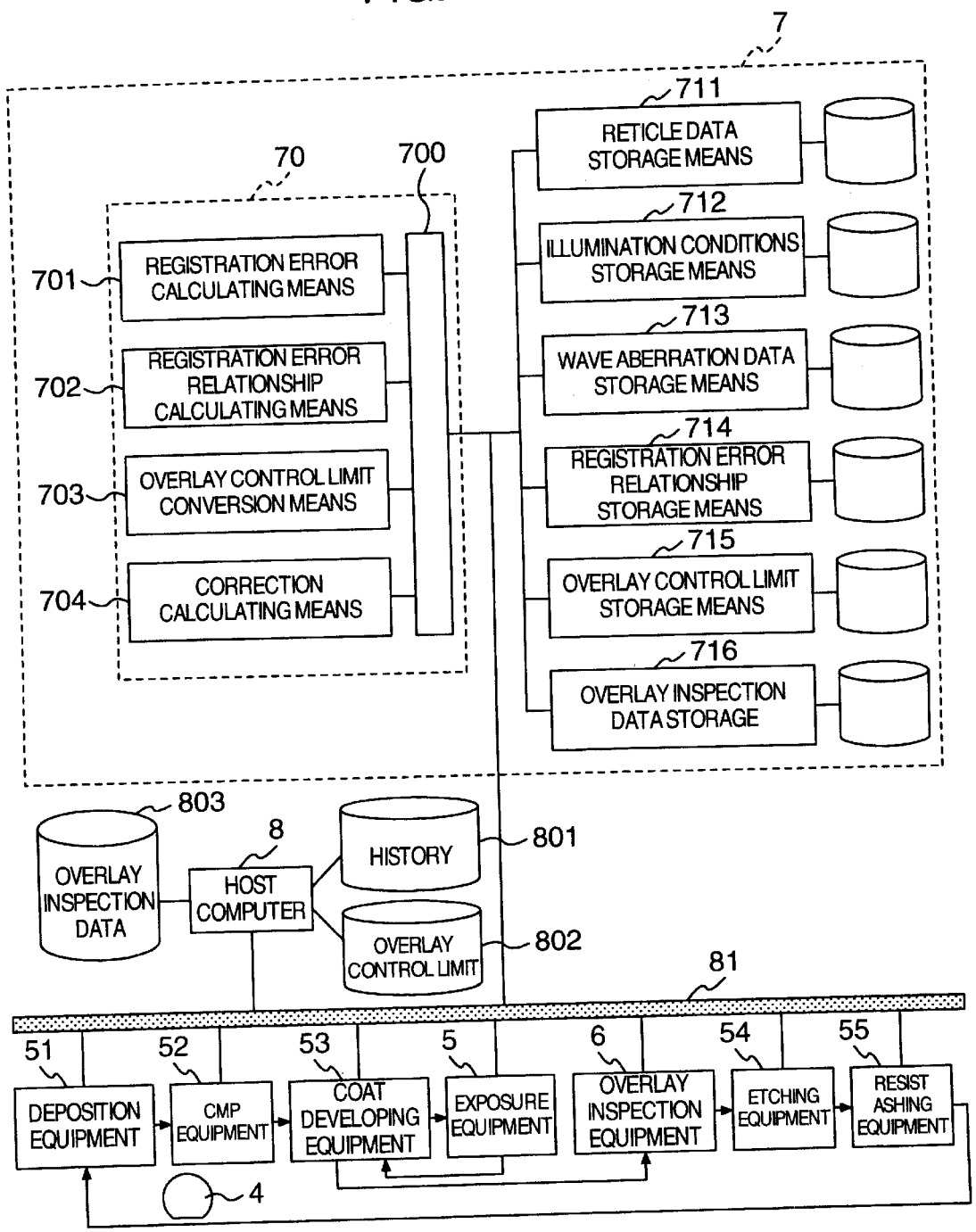
FIG. 17 is a diagram for explaining semiconductor device manufacturing system in accordance with an embodiment of the present invention.
Figure 18A:
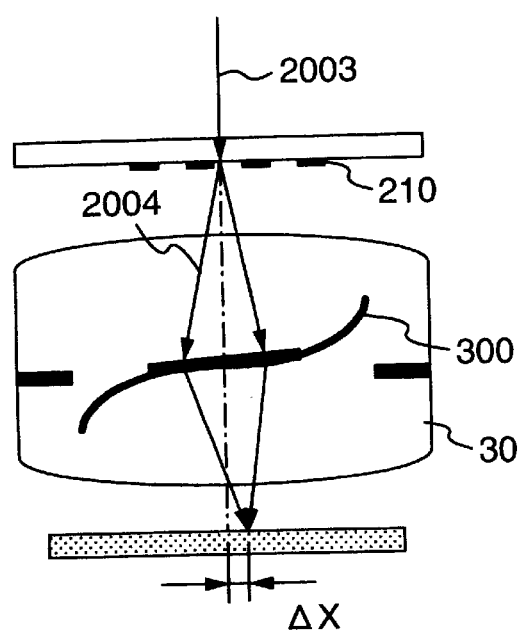
FIGS. 18A and 18B are diagrams for explaining a relationship between pattern spatial frequency and transfer image registration error.
Figure 18B:
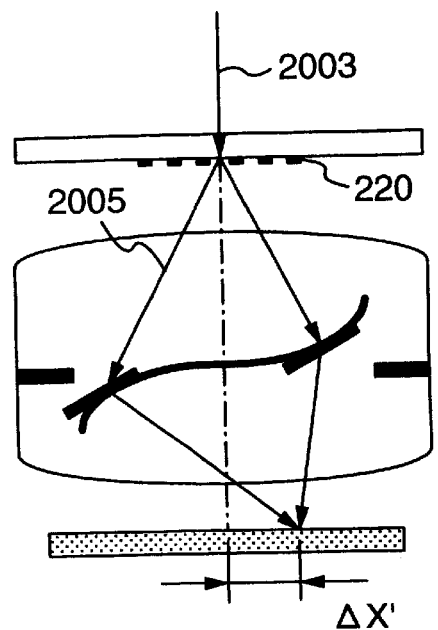
Figure 19A:
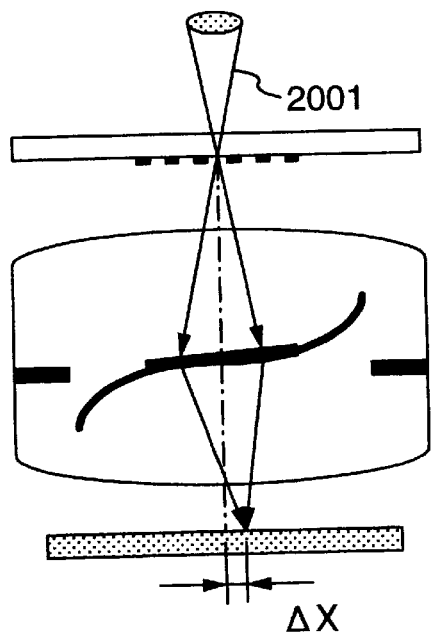
FIGS. 19A and 19B are diagrams for explaining a relationship between illumination conditions and transfer image registration error.
Figure 19B:
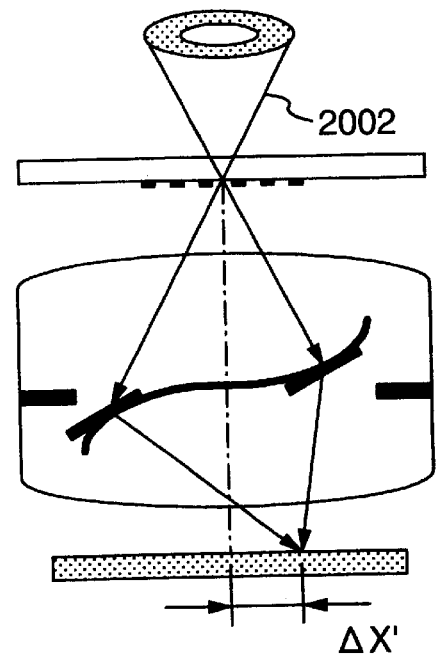
Figure 20:
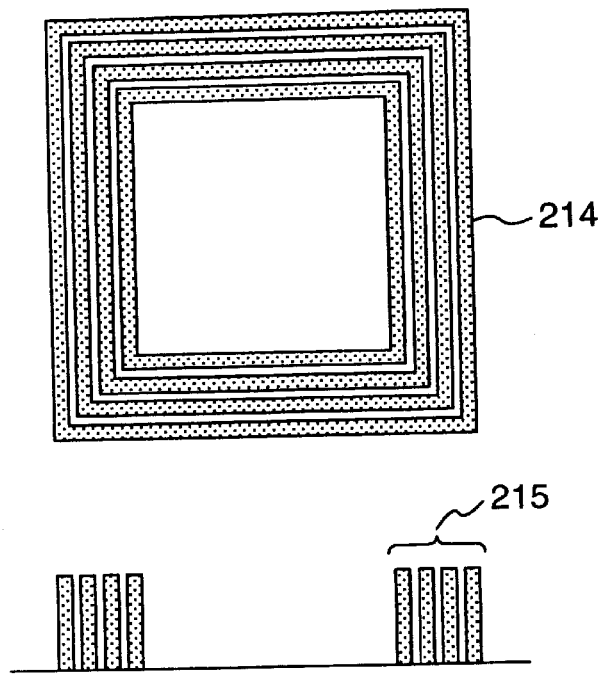
FIG. 20 is a diagrams for explaining an overlay mark made up of a plurality of lines in a prior art.
Figure 21:
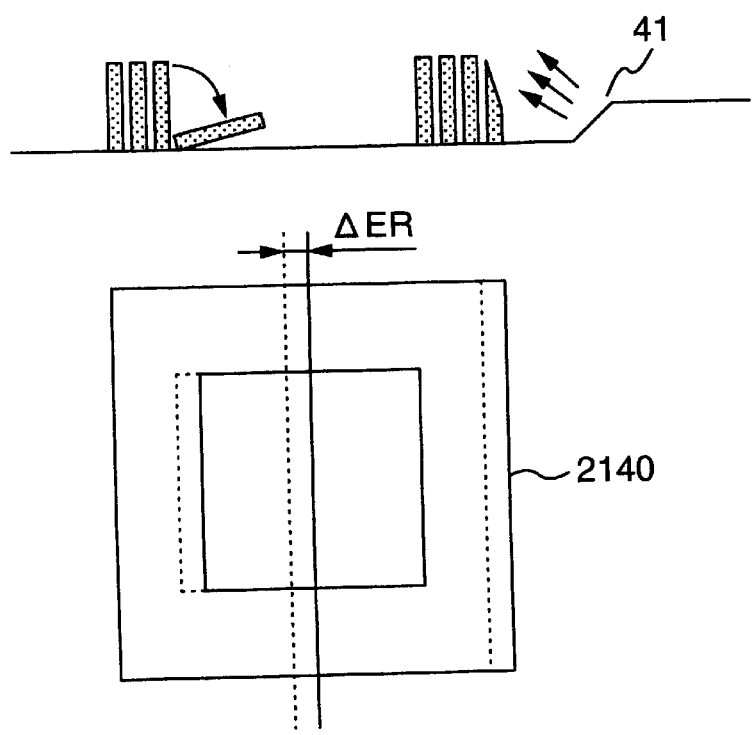
FIG. 21 is a diagram for explaining a problem associated with the overlay marks in the prior art.

Explanation will next be made as to semiconductor device manufacturing system in accordance with an embodiment of the present invention, with reference to FIG. 17.

For manufacturing a semiconductor device, a film is deposited by a deposition equipment 51 on a substrate 4 to be exposed with light, the film is flattened by a chemical mechanical polishing (CMP) equipment 52, and then resist as a photosensitive agent is coated on the substrate. Thereafter a circuit pattern is transferred onto the photosensitive agent on the substrate 4 by an exposure equipment 5, the photosensitive agent is developed by a coat developing equipment 53, and then the circuit pattern is inspected by an overlay inspection equipment 6 with respect to overlay. After the substrate is etched by an etching equipment 54, the resist is removed or ashed by a resist ashing equipment 55 and a film as a next layer is deposited by the deposition equipment 51 on the substrate. By repeating such a process, a semiconductor device can be manufactured.

History data on the processing of the substrate are sent from the above manufacturing apparatus via a network 81 to the host computer 8. For example, the type, process and lot number of the substrate 4, the equipment number used for the processing, recipe data about illumination conditions, reticle name, etc. are sent from the exposure equipment 5$m$ and saved in a history storage 801 of a host computer 8. An overlay control limit is input manually or from another computer and stored in an overlay control limit storage 802 of the host computer 8. An overlay inspection data of the overlay inspection equipment 6 is usually sent to the host computer 8 and registered in an overlay inspection data storage 803.

Explanation will next be made as to a semiconductor device manufacturing system 7 in accordance with the present invention. First, data about the dimensions (such as width and pitch), coordinate data of a circuit pattern and overlay mark are registered in a reticle data storage means 711 together with a reticle name. The data may be input manually or from another computer. When one of the same reticles having the severest tolerance is selected for the circuit pattern to be registered, the accuracy of abnormality detection can be enhanced. Further, data on illumination conditions at the time of light exposure is obtained from the history storage 801 of the host computer 8 and stored in an illumination conditions storage means 712. Wave aberration data is measured by the aforementioned method, and previously registered in a wave aberration data storage means 713 for each exposure equipment 5 and for each coordinate value on the reticle. A control means 700 instructs a registration error calculating means 701 to calculate a registration error at timing when these data are newly registered.

The registration error calculating means 701 gets dimension and coordinate data about the circuit pattern and overlay mark from the reticle data storage means 711, illumination conditions from the illumination conditions storage means 712, and wave aberration data corresponding to the coordinate values of the circuit pattern and overlay mark from the wave aberration data storage means 713; and calculates a registration error between the circuit pattern and overlay mark by the above method. Next a registration error relationship calculating means 702 calculates a registration error relationship between the circuit pattern and overlay mark on the basis of the calculated registration error, and registers it in a registration error relationship storage means 714.

Next an overlay control limit conversion means 703 modifies the control limit being registered in an overlay control limit storage means 715, and registers the modified value in the overlay control limit storage means 715. The processing until here is previously carried out to the processing movement of the substrate 4.

Explanation will then be made as to the processing when the substrate 4 is exposed with light and when overlay inspection data is sent from the overlay inspection equipment 6 to the control means 700. The control means 700 first inquires the host computer 8 to obtain exposure equipments, reticle, illumination conditions in the first and second processes already registered in the history storage 801.

On the basis of history information on the exposure equipments, illumination conditions and reticle of the first and second layer formation processes, the control means 700 reads out a corresponding registration error relationship from the registration error relationship storage means 714. The control means 700 sorts the overlay inspection data according to the exposure substrates to be inspected and registers it in an overlay inspection data storage 716. A correction calculating means 704 calculates a correction using the above registration error relationship and transmits it to the host computer 8, and the host computer 8 transmits the correction to the exposure equipment 5 at the time of the next light exposure. In this connection, the correction calculating means 704 may obtain the correction by making inquiry to the overlay inspection data storage 716 and performing such calculation as to find an average value over the corresponding past data. Through such calculation, accurate correction not affected by the noise component of the overlay inspection data can be calculated.

The control means 700 also judges whether or not the received overlay inspection data is within the control limits with use of the corresponding overlay control received from the overlay inspection data storage 716, and when the data exceeds the control limit, the control means transmits the effect to the host computer 8. In this connection, the control means may send a modified value of the overlay control limit to the host computer to judge an abnormal value.

The effects obtained by typical ones of the inventions disclosed in the present application are summarized as follows.

(1) The registration error of the circuit pattern can be accurately predicted from the measured value of the registration error of the overlay mark, a suitable correction can be set for the exposure equipment, and the yield of the semiconductor device can be improved.

(2) Since a correction can be set for the circuit pattern having the severest overlay tolerance, the yield can be further increased.

(3) only by controlling the overlay inspection data, generation of an abnormality in the overlay error of the circuit pattern can be detected, and thus its abnormality analysis and measure can be quickly carried out.

(4) The registration error relationship between the circuit pattern and overlay mark can be quickly extracted from the history of the substrate to be exposed, and abnormality detection of the overlay inspection and correction feedback to the exposure equipment can be quickly carried out.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of the equivalency of the claims are therefore intended to be embraced therein.

What is claimed is:

1. A method for correcting a lateral registration error between semiconductor device manufacturing steps, the method comprising:

reading a dimension of a circuit pattern in a first layer formation process;

reading a dimension of an overlay mark in said first layer formation process;

reading illumination conditions in an exposure device in said first layer formation process;

reading a wave aberration corresponding to said circuit pattern in the exposure device in said first layer formation process;

reading a wave aberration corresponding to said overlay mark in said first layer formation process;

calculating projection images of said circuit pattern and said overlay mark in said first layer formation process;

reading a dimension of a circuit pattern in a second layer formation process;

reading a dimension of an overlay mark in said second layer formation process;

reading illumination conditions in an exposure device in said second layer formation process;

reading a wave aberration corresponding to said circuit pattern in the exposure device in said second layer formation process;

reading a wave aberration corresponding to said overlay mark in said second layer formation process;

calculating projection images of said circuit pattern and said overlay mark in said second layer formation process;

calculating a registration error between the projection image of the circuit pattern in said first layer formation process and the projection image of the circuit pattern in said second layer formation process as well as a registration error between the projection image of the overlay mark in said first layer formation process and the projection image of the overlay mark in said second layer formation process;

finding a relationship between the registration error of the projection image of said circuit pattern and the registration error of the projection image of said overlay mark;

measuring a registration error between the overlay marks formed on a substrate of a semiconductor device by the first layer formation process and the second layer formation process;

predicting a registration error of the circuit patterns formed on the substrate of the semiconductor device by the first layer formation process and the second layer formation process, by using information of said measured registration error of the overlay marks and said calculated registration error; and feeding back said predicted registration error of the circuit patterns to the exposure device of said second layer formation process as a correction value.

2. The method as set forth in claim 1, wherein said circuit pattern is a circuit pattern having the smallest shift allowable value among the circuit patterns in the first and second layer formation processes.

3. A method for correcting a lateral registration error between semiconductor device manufacturing steps, the method comprising:

calculating a registration error between an image of a first circuit pattern formed when a circuit pattern of a first layer formation process is transferred with use of a first exposure device and an image of a second circuit pattern formed when a circuit pattern of a second layer formation process is transferred onto the image of said first circuit pattern with use of a second exposure device;

calculating a registration error between an image of a first overlay mark formed when an overlay mark of said first layer formation process is transferred with use of said first exposure device and an image of a second overlay mark formed when an overlay mark of said second layer formation process is transferred with use of said second exposure device;

determining a relationship between said calculated registration error between the transferred images of said first and second circuit patterns and said calculated registration error between the images of said first and second overlay marks;

measuring a registration error between a transferred image formed when said first overlay mark is transferred with use of said first exposure device and a transferred image formed when said second overlay mark is transferred with use of said second exposure device;

predicting a registration error between transferred images of actual circuit patterns from said measured registration error with use of said determined relationship between said calculated registration errors of said circuit patterns and overlay marks; and determining a correction of the exposure device of said second layer formation process from said predicted registration error between the transferred images of the actual circuit patterns and feeding said correction back to the exposure device of said second layer formation process.

4. A method for inspecting a semiconductor substrate, the method comprising:

calculating registration errors between transfer images of first and second overlay marks and circuit patterns when the first overlay mark and circuit pattern are transferred on a substrate with use of a first exposure device and when the second overlay marks and circuit patterns are transferred on the substrate with use of a second exposure device, the projection images obtained by the second exposure device being transferred onto said substrate at an area where said first overlay mark and circuit pattern are transferred;

determining a relationship between said calculated registration error between the transfer images of the overlay marks and said calculated registration error between the transfer images of the circuit patterns;

measuring an actual registration error between the transfer images of the first and second overlay marks formed when said first overlay mark is actually transferred with use of the first exposure device and when said second overlay mark is actually transferred with use of the second exposure device;

predicting a registration error between the transfer images of the circuit patterns using data relating to said measured registration error, said determined relationship between the registration errors of the circuit patterns and the registration errors of the overlay marks;

determining a correction value of the exposure device in said second layer formation process from said predicted registration error between the transfer images of the circuit patterns;

correcting said second exposure device on the basis of said determined correction value; and subjecting the second circuit pattern by said corrected second exposure device to light exposure on the first circuit pattern subjected to light exposure by said first exposure device.

5. The method as set forth in claim 4, wherein said registration error between the transfer images of the circuit patterns is calculated with use of information on a dimension of the first circuit pattern and on a dimension of the second circuit pattern to be formed on said first circuit pattern, information on illumination conditions of the first exposure device for light exposure of said first circuit pattern and on illumination conditions of the second exposure device for light exposure of said second circuit pattern, and information on a wave aberration of said first exposure device and on a wave aberration of said second exposure device.

6. A method for inspecting a substrate, the method comprising:

calculating a relationship between a registration error between projection images of first and second circuit patterns and a registration error between projection images of first and second overlay marks with use of information on a dimension of said first circuit pattern and a dimension of said second circuit pattern to be formed on said first circuit pattern, information on illumination conditions of the first exposure device for light exposure of said first circuit pattern and on illumination conditions of the second exposure device for light exposure of said second circuit pattern, and information on a wave aberration of said first exposure device and on a wave aberration of said second exposure device;

measuring an actual registration error between a projection image formed when said first overlay mark is actually transferred with use of said first exposure device and a projection image formed when said second overlay mark is actually transferred with use of said second exposure device;

predicting an actual registration error between the projection images of the circuit patterns from data about said actual registration error between the projection images of the overlay marks with use of said calculated relationship between the registration errors between the projection images of the circuit patterns and overlay marks;

correcting said exposure device of a second layer formation process on the basis of a correction corresponding to said predicted actual registration error between the projection images of the circuit patterns; and subjecting said second circuit pattern by said corrected second exposure device to light exposure on said first circuit pattern subjected by said first exposure device to light exposure.

7. The method as set forth in claim 6, wherein, in said step of correcting the exposure device of said second layer formation process, the exposure device of said second layer formation process is corrected by feeding a correction corresponding to said predicted actual registration error between the projection images of the circuit patterns back to the exposure device of said second layer formation process.

8. The method as set forth in claim 6, wherein, in said step of correcting the exposure device of said second layer formation process, the exposure device of said first layer formation process is corrected on the basis of a correction corresponding to said predicted actual registration error between the projection images of the circuit patterns.

9. A method for inspecting a substrate, the method comprising:

measuring an actual registration error between a projection image formed when a first overlay mark formed on a first reticle is actually transferred on a substrate with use of a first exposure device and a projection image formed when a second overlay mark formed on a second reticle is actually transferred on said substrate with use of a second exposure device;

predicting an actual registration error between the projection images of the actual circuit patterns from data on said measured registration error between the projection images of the overlay marks with use of a relationship between a projection image formed when a first circuit pattern formed on said first reticle is transferred on said substrate with use of said first exposure device and a projection image formed when a second circuit pattern formed on said second reticle is transferred on the substrate with use of said second exposure device and said registration error between the projection images of the overlay marks;

correcting said second exposure device on the basis of information on said predicted actual registration error between the projection images of the circuit patterns; and subjecting said second circuit pattern by said corrected second exposure device to light exposure on said first circuit pattern subjected by said first exposure device to light exposure.

10. The method as set forth in claim 9, wherein, in said step of correcting said second exposure device, said second exposure device is corrected by feeding a correction corresponding to said predicted actual registration error between the projection images of the circuit patterns back to said second exposure device.

11. The method as set forth in claim 9, wherein, in said step of correcting said second exposure device, said first exposure device is also corrected on the basis of a correction corresponding to said predicted actual registration error between the projection images of the circuit patterns.

12. A method for inspecting a substrate, the method comprising:

measuring a registration error between a first transferred image of a first pattern formed on or over the substrate when a first overlay mark formed on a first reticle is transferred to the substrate with use of a first exposure device and a second transferred image of a second pattern formed over the first pattern when a second overlay mark formed on a second reticle is transferred to said substrate with use of a second exposure device;

predicting a registration error between third and fourth images of first and second circuit patterns associated with the substrate using data on said measured registration error; and adjusting said second exposure device using said predicted registration error between the third and fourth images of the first and second circuit patterns.

13. The method of claim 12, further comprising:

using said adjusted second exposure device to transfer said second circuit pattern to said substrate.

* * * * *